US008804313B2

(12) United States Patent
Peterson et al.

(10) Patent No.: US 8,804,313 B2
(45) Date of Patent: Aug. 12, 2014

(54) ENCLOSURE POWER DISTRIBUTION ARCHITECTURES

(75) Inventors: Eric C. Peterson, Woodinville, WA (US); Shaun L. Harris, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 228 days.

(21) Appl. No.: 13/530,466

(22) Filed: Jun. 22, 2012

(65) Prior Publication Data

US 2013/0342968 A1     Dec. 26, 2013

(51) Int. Cl.
| | |
|---|---|
| H02B 1/26 | (2006.01) |
| H05K 1/00 | (2006.01) |
| H05K 5/00 | (2006.01) |
| G06F 1/18 | (2006.01) |
| G06F 1/26 | (2006.01) |
| G06F 1/16 | (2006.01) |

(52) U.S. Cl.
USPC ...... 361/622; 361/601; 361/679.02; 361/736; 361/792; 307/43; 307/58; 307/65; 439/59; 439/61; 439/65

(58) Field of Classification Search
USPC ............ 361/601, 679.02, 605, 622, 641, 644, 361/736, 792, 775, 796, 797, 752, 361/725–728; 307/24, 38, 28, 25, 18, 20, 307/58, 43, 55, 69, 86, 113, 125, 147, 130, 307/12, 13; 439/65, 66, 61, 62, 64, 581
See application file for complete search history.

(56) References Cited

U.S. PATENT DOCUMENTS

| | | | | | |
|---|---|---|---|---|---|
| 4,511,950 | A | * | 4/1985 | Bunner et al. | 361/788 |
| 4,685,032 | A | * | 8/1987 | Blomstedt et al. | 361/803 |
| 5,390,081 | A | * | 2/1995 | St. Pierre | 361/775 |
| 5,726,506 | A | * | 3/1998 | Wood | 307/147 |
| 5,949,656 | A | * | 9/1999 | Pinault | 361/788 |
| 6,006,298 | A | * | 12/1999 | Satoh | 710/302 |
| 6,066,900 | A | * | 5/2000 | Chan et al. | 307/38 |

(Continued)

OTHER PUBLICATIONS

Govindan, et al., "Towards Realizing a Low Cost and Highly Available Datacenter Power Infrastructure", Published Date: Oct. 23, 2011, Proceedings: HotPower '11 Proceedings of the 4th Workshop of Power-Aware Computing and Systems, pp. 1-5, http://www.cse.psu.edu/~sgovinda/papers/hotpower11.pdf.

(Continued)

*Primary Examiner* — Michail V Datskovskiy
(74) *Attorney, Agent, or Firm* — Jim Sfekas; Kate Drakos; Micky Minhas

(57) ABSTRACT

Computational enclosures may be designed to distribute power from power supplies to load units (e.g., processors, storage devices, or network routers). The architecture may affect the efficiency, cost, modularity, accessibility, and space utilization of the components within the enclosure. Presented herein are power distribution architectures involving a distribution board oriented along a first (e.g., vertical) axis within the enclosure, comprising a power interconnect configured to distribute power among a set of load boards oriented along a second (e.g., lateral) axis and respectively connecting with a set of load units oriented along a third (e.g., sagittal) axis, and a set of power supplies also oriented along the third axis. This orientation may compactly and proximately position the loads near the power supplies in the distribution system, and result in a comparatively low local current that enables the use of printed circuit boards for the distribution board and load boards.

20 Claims, 8 Drawing Sheets

(56) References Cited

U.S. PATENT DOCUMENTS

| | | | | |
|---|---|---|---|---|
| 6,147,863 | A * | 11/2000 | Moore et al. | 361/679.6 |
| 6,489,748 | B1 * | 12/2002 | Okamura | 320/116 |
| 6,661,119 | B2 * | 12/2003 | Liu et al. | 307/71 |
| 6,677,687 | B2 * | 1/2004 | Ho et al. | 307/43 |
| 6,833,634 | B1 * | 12/2004 | Price | 307/18 |
| 7,394,170 | B2 * | 7/2008 | Kirkorian | 307/69 |
| 7,437,496 | B2 * | 10/2008 | Oster | 710/302 |
| 7,671,490 | B2 * | 3/2010 | Hartung et al. | 307/115 |
| 7,713,068 | B2 * | 5/2010 | Flynn et al. | 439/65 |
| 8,259,450 | B2 * | 9/2012 | Dunwoody et al. | 361/699 |
| 8,363,388 | B2 * | 1/2013 | Wise et al. | 361/622 |
| 8,576,570 | B2 * | 11/2013 | Nguyen et al. | 361/730 |
| 2004/0150964 | A1 * | 8/2004 | Uzuka et al. | 361/760 |
| 2008/0253085 | A1 | 10/2008 | Soffer | |
| 2010/0328849 | A1 | 12/2010 | Ewing | |
| 2011/0019352 | A1 * | 1/2011 | Kwon et al. | 361/679.02 |
| 2011/0169562 | A1 | 7/2011 | Li | |
| 2012/0243160 | A1 * | 9/2012 | Nguyen et al. | 361/679.08 |

OTHER PUBLICATIONS

Meisner, et al., "Does Low-Power Design Imply Energy Efficiency for Data Centers?", Published Date: Aug. 1, 2011, pp. 109-114, Proceedings: ISPLED '11 Proceedings of the 17th IEEE/ACM International Symposium on Low-Power Electronics and Design, http://www.eecs.umich.edu/~twenisch/papers/ispled11.pdf.

Pelley, et al., "Power Routing: Dynamic Power Provisioning in The Data Center", Published Date: Mar. 13, 2010, pp. 231-242, Proceedings: ASPLOS '10 Proceedings of the Fifteenth Edition of ASPLOS on Architectural Support for Programming Languages and Operating Systems, http://www.eecx.umich.edu/~twenisch/papers/asplos10.pdf.

Jong, et al., "DC Power Distribution for Server Farm", Published Date: Sep. 2007, pp. 1-14, http://www.chip2grid.net/docs/LEONARDO%20ENERGY.pdf.

"Metered-by-Outlet Rack PDU", Retrieved Date: Jan. 20, 2012, pp. 1-2, http://www.apc.com/products/family/index.cfm?id=478.

\* cited by examiner

ENCLOSURE POWER DISTRIBUTION ARCHITECTURES

BACKGROUND

Within the field of computing, many scenarios involve a computational architecture comprising an enclosure configured to provide power, from one or more power supplies connected to a power source, to a set of load units that apply a load to the provided power, such as computational processors, storage, or network routing. As a first example, a rack server may comprise a set of racks, each sized to hold a computational unit, such as a cased or caseless mainboard including a processor, memory, a power supply, and one or more storage devices, network adapters, and other expansion cards. The mainboard may include a power supply having a power inlet (usually positioned toward the back of the unit) that may be attached to a power outlet of the rack via a power cable, and a network port that may be attached to a network port of the rack using a network cable. As a second example, a blade server may comprise a set of slots, wherein a structural unit may comprise a set of parallel slots respectively configured to receive a computational unit of a "blade" form factor (e.g., a thin, substantially planar array of computational components). The enclosure may therefore store a horizontal or vertical stack of blades, each having an array of components, such as a processor, memory, a storage device, and a power supply, and may provide other services (such as power and network access) through cable attachments to various ports and outlets provided in the enclosure.

In these and other examples, the enclosure involves a distribution of power from the power supplies to the load units. A basic enclosure may simply connect each load unit with a dedicated power supply, but this architecture may cause any load unit to fail if the power supply fails, or if the power connection through the power supply is disconnected or otherwise interrupted. Other enclosures may distribute the power provided by two or more power supplies to the load units, e.g., by including a distribution grid that enables any power supply to be connected to any load unit, or a bus bar that provides a store of power from several power supplies to a set of load units. Some such enclosures may include a reserve power supply that may be (automatically or by user selection) connected with a load unit in place of a failed power supply, thus achieving "N+1" resilience of the power supplies within the enclosure.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

While many enclosure architectures may connect power supplies with load units, some such architectures may present advantages or disadvantages with respect to other enclosures. As a first example, it may be desirable to enable distribution of power from a set of power supplies to a set of load units in order to provide fault tolerance in the event of a failure or disconnection of one or more power supplies. As a second example, it may be desirable to modularize the power distribution and the load units, such that some or all of the load units may be removed without altering the positions of the power supplies and power distribution components, and new load units may be inserted into the architecture to connect with the power components with little or no manual manipulation of connectors by a user. Conversely, it may be desirable to provide access and detachability to the power distribution system for maintenance without altering the positions of the load units. As a third example, it may be desirable to economize the connections among the power distribution components and load units, such as by reducing or eliminating cabling. As a fourth example, it may be desirable to position the connectors of the distribution system such that the load units and the power supplies, when connected, are efficiently positioned within the enclosure. As a fifth example, it may be desirable to position load units at a comparatively short and uniform distance from power supplies in order to stabilize voltage, reduce maximum local current through the power distribution system, and balance power phases among the power supplies and load units. As a sixth example, it may be desirable to modularize power distribution among different groups of power supplies and load units, and also the expansion of distribution among such groups through an interconnection. As a seventh example, it may be desirable to configure the power distribution system in such a manner that connected load units are exposed to directed airflow within the enclosure in order to provide temperature and climate regulation.

Presented herein are architectures that may present some of these advantages. In accordance with these architectures, an enclosure may comprise a distribution board having a distribution board surface comprising a set of power connectors connectible with respective power supplies; a set of load board connectors connectible with respective load boards; and a power interconnection that interconnects the power connectors and load board connectors to enable power distribution. The distribution board surface may be oriented along a first axis within the enclosure (e.g., a vertical axis), and may position the load connectors such that connected load boards are oriented within the enclosure along a second axis that is orthogonal with the first axis (e.g., a lateral axis). Additionally, the power connectors may be positioned on the distribution board surface such that power supplies connected with the power connectors are oriented along a third axis within the enclosure that is orthogonal with the first axis and the second axis (e.g., a sagittal axis), and the load boards may comprise load unit connectors positioned such that connected load units are also oriented along the third axis within the enclosure.

This organization of the power distribution may enable compact, modular, and accessible storage of the power supplies and load units. The distribution of power through load boards, each connecting one or more load units, may further extend the modularity of the load units stored within the enclosure. Additionally, because proximity of the power supplies to the load units may stabilize the voltage and/or reduce the local current and load through the interconnection, the distribution board and load boards may be designed as a printed circuit board (PCB) instead of bus bars designed to convey higher loads, thus enabling high power distribution and loads while economizing the costs and resources of the distribution system. These and other advantages may be achievable through the design of the power distribution system of an enclosure according to the architectures presented herein.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent

DETAILED DESCRIPTION

Figure 1:
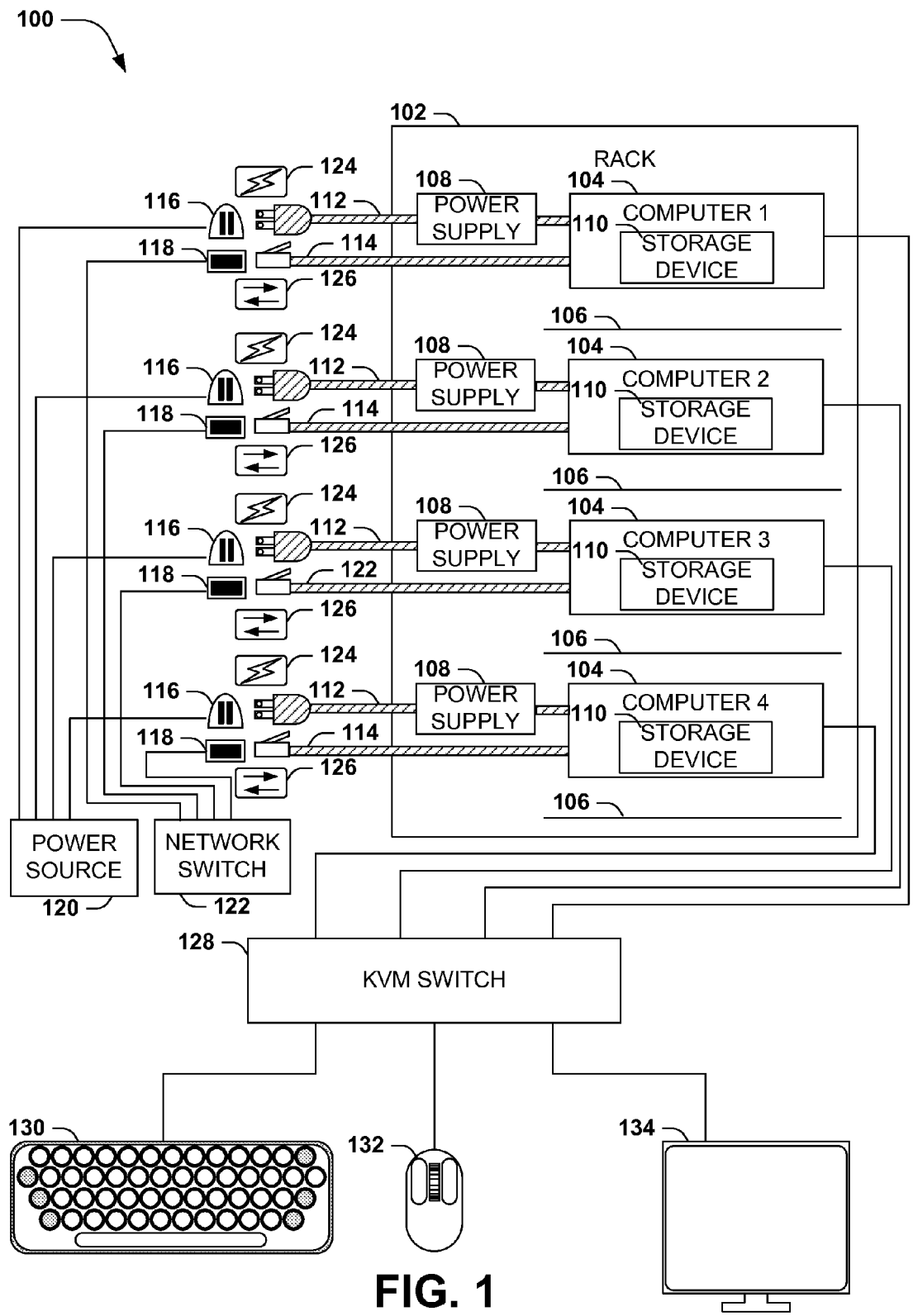
FIG. 1 is an illustration of an exemplary scenario featuring a rack configured to store computational units and power supplies.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are shown in block diagram form in order to facilitate describing the claimed subject matter.

A. Introduction

Within the field of computing, many scenarios involve a plurality of computational units stored together in an enclosure, such as a rack or cabinet. As a first example, the computational units may comprise a set of independently operable computers configured to intercommunicate to achieve a task in a cooperative manner, such as a server farm or a peer-to-peer processing network. As a second example, the computational units may comprise processors and/or storage arrays that are coordinated by a coordinating module, such as in a symmetric multiprocessor (SMP) model. As a third example, the computational components may autonomously process data, but may share resources such as input/output components, such as a rack server comprising a set of mainboards and a switch configured to enable user interaction with a single mainboard. In these scenarios, the enclosure may comprise a set of resources to provide various functionality (e.g., power supplies that supply power to the computational units; climate components (e.g., fans, heatsinks, air conditioners, heaters, humidifiers, and dehumidifiers) that regulate the temperature, humidity, and/or airflow of the components; communication components, such as wired and/or wireless network adapters and network switches; user input components, such as keyboards, mice, microphones, and cameras; user output components, such as displays, speakers, and printers; and physical protection, such as enclosures and physical locks. In various scenarios, each computational unit may have a dedicated resource (e.g., each computer may have a separate enclosure and dedicated input/output devices), or a resource may be shared among two or more computational units (e.g., in a rack server, each computational unit may have a dedicated processor and volatile storage, and may provide a pool of nonvolatile storage, such as a redundant array of inexpensive disks (RAID) unit, that is shared by all of the units for nonvolatile storage). Additionally, the degree of integration of the computational units may vary in different server scenarios from complete independence (e.g., units that provide independent functions and that seldom intercommunicate, or are even isolated from each other; units that operate independently but intercommunicate to achieve a particular task; or units that are incapable of independent operation without direction from a management module).

FIG. 1 presents an illustration of an exemplary scenario 100 featuring a multi-unit rack server, comprising a rack 102 configured to store a set of computers 104 on a vertical array of shelves 106. In this exemplary scenario 100, each computer 104 is connected to a power supply 108 stored on the shelf 106 and attached to the computer 104 via a power cable 112, and comprises an enclosure featuring a complete set of computational components, such as one or more processors and a storage component 110. In addition to providing a physical structure and organization of the computers 104, the rack 102 comprises a set of standard power outlets 116, into which a power cable 112 of the power supply 108 may be inserted to receive power 124 from a power source 120, thus enabling any computer 104 to be powered through its ordinary power supply 108. The computers 104 may also include communications components, such as an Ethernet network adapter that connects through a network cable 114 and a network port 118 to a network in order to enable intercommunication with other network components, such as other computers 104 and a network switch 122. The rack 102 may also include a keyboard/video/mouse ("KVM") switch 128, to which are connected a keyboard 130, mouse 132, and video display 134, as well as one or more connections with respective computers 104 (e.g., a High Definition Multimedia Interface (HDMI) cable or a Universal Serial Bus (USB) cable). The switch 128 may present a toggle that enables the connection of these devices to any computer 104 positioned in the rack 102. By presenting these components in addition to the physical structure and organization of the shelves 106, the rack 102 therefore supports the functioning, interoperation, and resource-sharing of the computers 104 stored therein.

In particular, the rack 102 illustrated in the exemplary scenario 100 of FIG. 1 enables respective computers 104 to be connected to the power source 120 via a dedicated power supply 108. Although simple, this architecture may present significant disadvantages. As a first exemplary disadvantage, this exemplary scenario 110 may exhibit poor resiliency in the event of a failure of a power supply 108, such as a blown fuse, short circuit, or physical disconnection from the computer 104 or the power outlet 116. Any such failure of any one power supply 108 may cause the connected computer 104 to fail. However, respective power supplies 108 may be unutilized or underutilized by the connected computer 104. Such failures may therefore be reduced by sharing power 124 provided by the power supplies 108 to the computers 104 in order to alleviate the failure of one or more power supplies 108. This sharing may be achieved through many configurations, which may involve altering the architecture of the rack 102 to incorporate power distribution resources. Additionally, such architectures may be selected in view of other advantages, such as economy of resources; high flexibility and low complexity of distribution; the stability, consistency, and economy of provided power (e.g., providing consistent current and phasing); convenience in coupling the computers 104 and power supplies 108 with the enclosure; and modularity to enable access to or removal of some components without manipulating other components.

Figure 2:
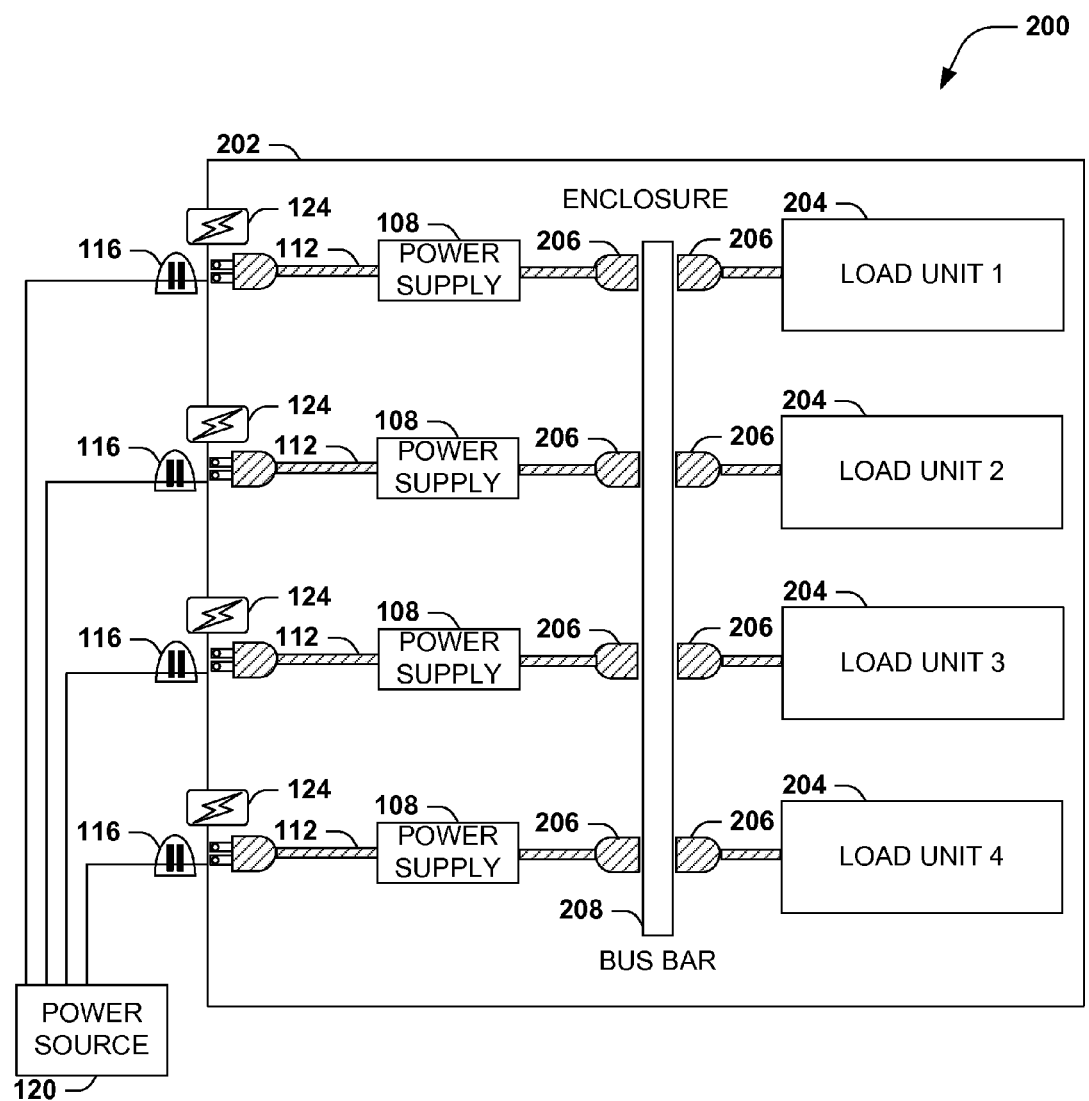
FIG. 2 is an illustration of an exemplary scenario featuring an enclosure configured to distribute power among a set of load units and a set of power supplies.

FIG. 2 presents an illustration of another exemplary scenario 200 featuring an enclosure 202 connecting a set of load units 204 (e.g., computational processors, storage devices, or network routers) with a power source 120 through a set of power supplies 108 in a shared manner. In this exemplary scenario 200, the enclosure 202 provides a bus bar 208, such as a copper strip or thick cable, to which respective load units 204 and power supplies 108 connect using a plug connector 206 in order to conduct and share power. In contrast with the dedicated power supplies 108 in the exemplary scenario 100 of FIG. 1, this enclosure 202 enables a sharing of power 124, such that a failure of one power supply 108 may be compensated by the remaining power supplies 108 to avoid a failure of any load unit 204. However, in order to tolerate the shared current of all of the power supplies 108, a bus bar 208 is often fabricated as a thick band of copper or other conductive metal, resulting in considerable cost, energy transfer inefficiency, and excessive heat generation. The inclusion of cables 112 and plug connectors 206 connecting the power supplies 108 and load units 204 to the bus bar 208 may involve additional expense and consumption of space within the enclosure 202, and may present additional points of failure. Additionally, it may be difficult for a user to access the power supplies 108 and load units 204 within the enclosure 202 without manipulating or working around other components; e.g., if the power supplies 108 are positioned behind the load units 204, the user may have to remove one or more load units 204 to access the power supplies 108 for testing or maintenance, or vice versa. The space utilization of the components within the enclosure 202 may be inefficient; e.g., this architecture may present problems such as cable management and accessibility (e.g., difficulty in plugging the components into the bus bar 208 in areas of the enclosure 202 that are cramped and/or difficult to visualize). Finally, these architectures may present problems with the stability, consistency, and economy of provided power (e.g., providing consistent current and phasing).

B. Presented Techniques

Presented herein are architectures for multi-unit enclosures that may present some advantages in comparison with the exemplary scenarios in FIGS. 1 and 2. In accordance with these techniques, an enclosure may comprise a distribution board featuring a power interconnect that connects a set of load board connectors and a set of power supply connectors. Respective power supply connectors may be connected with a power supply, while respective load board connectors may be connected with a load board, which, in turn, may be connected with one or more load units. Additionally, the techniques presented herein relate to the positions and orientations of the power distribution components. The distribution board may comprise a distribution board surface oriented along a first axis of the enclosure (e.g., a vertical or top-to-bottom axis), with the load board connectors and power connectors distributed on the surface along the first axis. Respective load board connectors may be oriented along a second axis (e.g., a lateral or left-to-right axis) that is (substantially) orthogonal with the first axis, and that may connect with a load board oriented along the second axis (e.g., inserted from the front of the enclosure) to connect with the distribution board. The load units may connect with respective load boards along a third axis (e.g., a sagittal or front-to-back axis) that is (substantially) orthogonal with the first axis and the second axis. Similarly, respective power supply connectors may be oriented along the third access, and may connect with a power supply that is also oriented along the third axis (e.g., inserted from the back of the enclosure) to connect with the distribution board. Such configurations may present several advantages in terms of resource and space efficiency, accessibility, and consistency.

Figure 3:
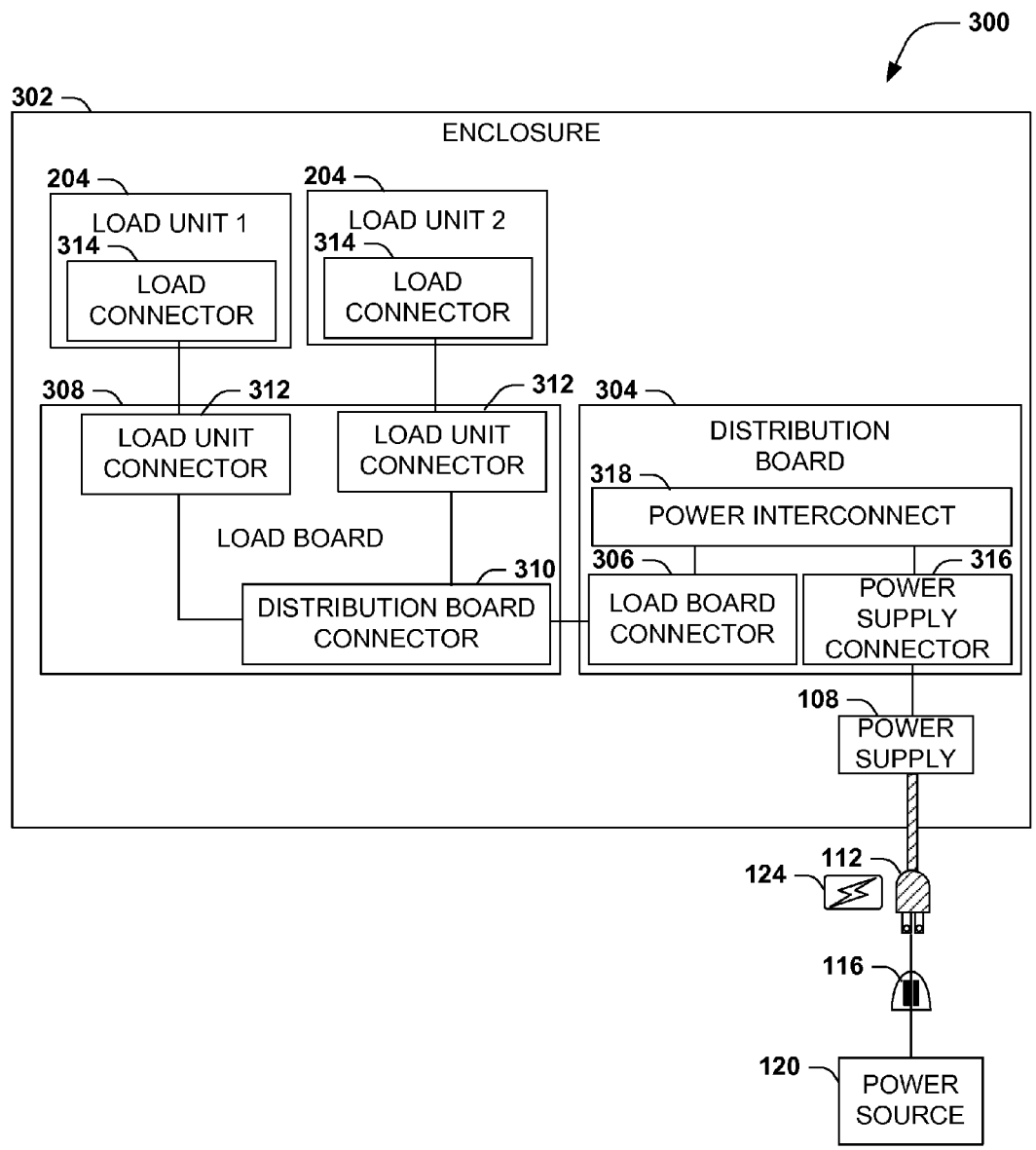
FIG. 3 is an illustration of an exemplary scenario featuring a cross-section view of an enclosure configured to distribute power among a set of load units and a set of power supplies according to the techniques presented herein.

FIG. 3 presents an illustration of an exemplary scenario 300 presenting a cross-sectional view along one axis of an enclosure 302 configured according to the techniques presented herein. It is to be appreciated that this cross-sectional view is presented as an introduction of the components of the architecture that is illustrated more fully in FIGS. 4 and 5. Also, while this view may represent a horizontal cross-section along a first axis (e.g., vertical) axis, other axial orientations and combinations of components may embody the concepts and techniques illustrated and presented herein.

In this exemplary scenario 300 of FIG. 3, the enclosure 302 stores a set of load units 204 (e.g., computational units, storage devices, or network routers) that are to be connected with at least one power supply 108 connected with a power source 120. In order to achieve this interconnection, the enclosure 302 comprises a distribution board 304 featuring load board connector 306 and a power supply connector 316 interconnected by a power interconnect 318. The load board connector 306 may couple the distribution board 304 with respective loads 204 by connecting with a distribution board connector 310 on a load board 308, which, in turn, comprises two load unit connectors 312 respectively connecting with a load connector 314 of a load unit 204. In particular, if the view of this enclosure 302 is understood to be a cross-section along a first axis (e.g., a "top-down" view), it may be appreciated that the load board 308 is oriented along a second axis (e.g., a laterally oriented load board 308), and that the load units 204, when connected with the load board 308, are oriented along a third axis (e.g., a front-to-back orientation of the load units 204). Additionally, the power supply connector 316 connects with a power supply 108 that is also oriented along the third axis (e.g., a front-to-back orientation of the power supply 108). This architecture thus enabling a conductivity path of power 124 from the power source 120 via the outlet 116 to the power cable 112 of the power supply 108, the power supply connector 316 of the distribution board 304, the power interconnect 318, the load board connector 306, the distribution board connector 310 of the load board 308, the load unit connectors 312, and finally with the load connectors 314 of the load units 204.

Figure 4:
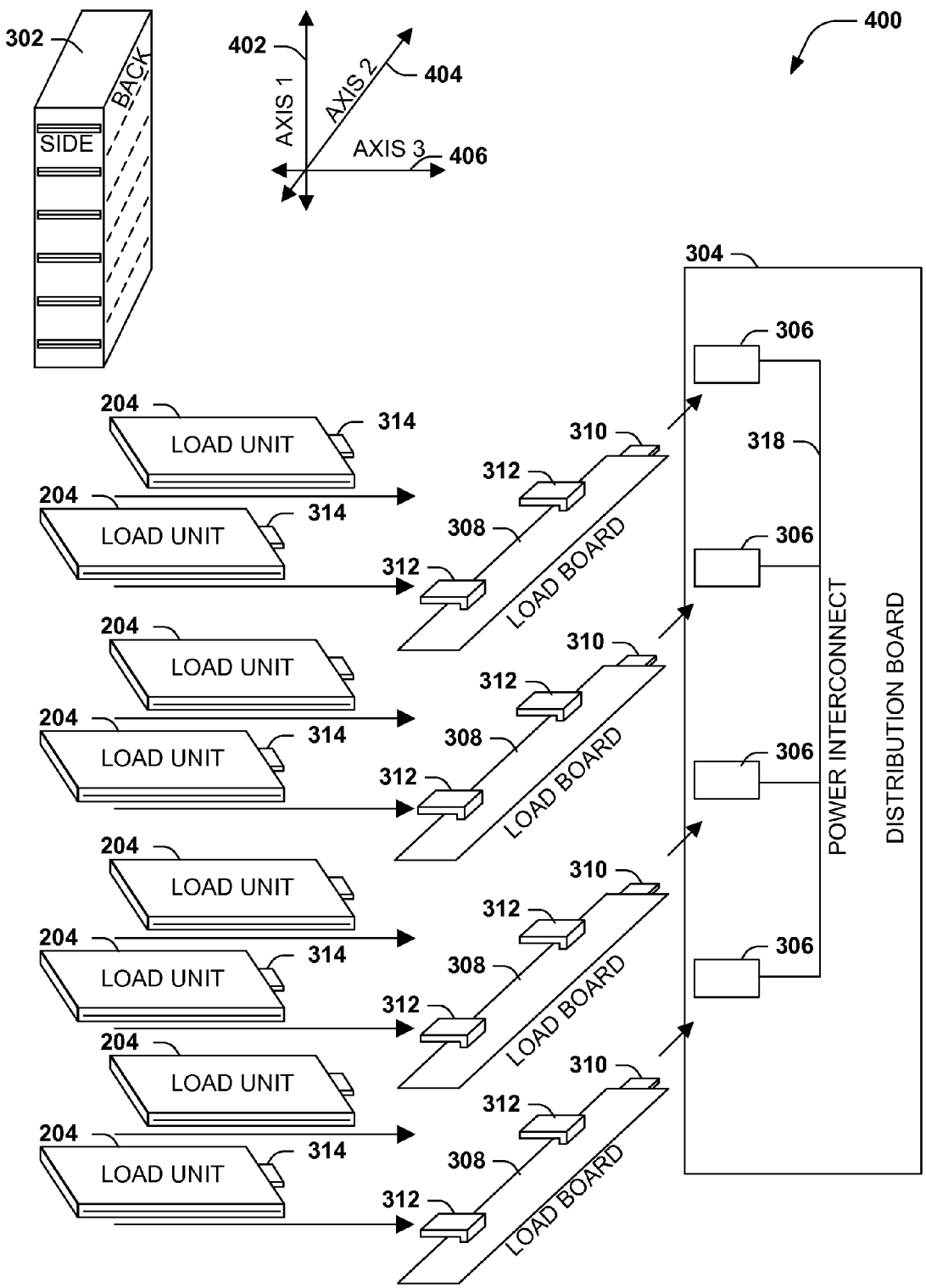
FIG. 4 is an illustration of an exemplary scenario featuring a first isometric view of an enclosure configured to distribute power among a set of load units and a set of power supplies according to the techniques presented herein.

FIG. 4 presents an illustration of an exemplary scenario 400 presenting a first isometric view of an enclosure 302 configured according to the techniques presented herein. In this exemplary scenario 400, as well as those of FIG. 5, FIG. 6, and FIG. 7, the enclosure 302 is illustrated with a first axis 402 (e.g., a vertical axis), a second axis 404 (e.g., a lateral axis), and a third axis 406 (e.g., a sagittal axis), such that the front of the enclosure 302 may be envisioned as oriented to the left of the figure and the back of the enclosure 302 may be envisioned as oriented to the right of the figure. In the first isometric view presented in the exemplary scenario 400 of FIG. 4, the distribution board 304 is presented as oriented along the first axis 402 (e.g., vertically), and having a set of load board connectors 306 distributed along the first axis 402 and oriented along the second axis 404. Respective load board connectors 306 may be connected with a distribution board connector 310 of a load board 308, which may also be oriented along the second axis 404 (e.g., laterally) within the enclosure 302. The load boards 308 may also connect with one or more load units 204 (e.g., trays storing computational units) by coupling a load unit connector 312 on the load board 308 with a load connector 314 of the load unit 204. The load units 204 are oriented within the enclosure 302 along the third axis 406 (e.g., inserted into the front of the enclosure 302) in order to connect with the load board 308. The distribution board 304 also features a power interconnect 318 that interconnects the load board connectors 306 of the load boards 308 in order to convey power from the power supplies 108 to the load boards 308 and load units 204.

Figure 5:
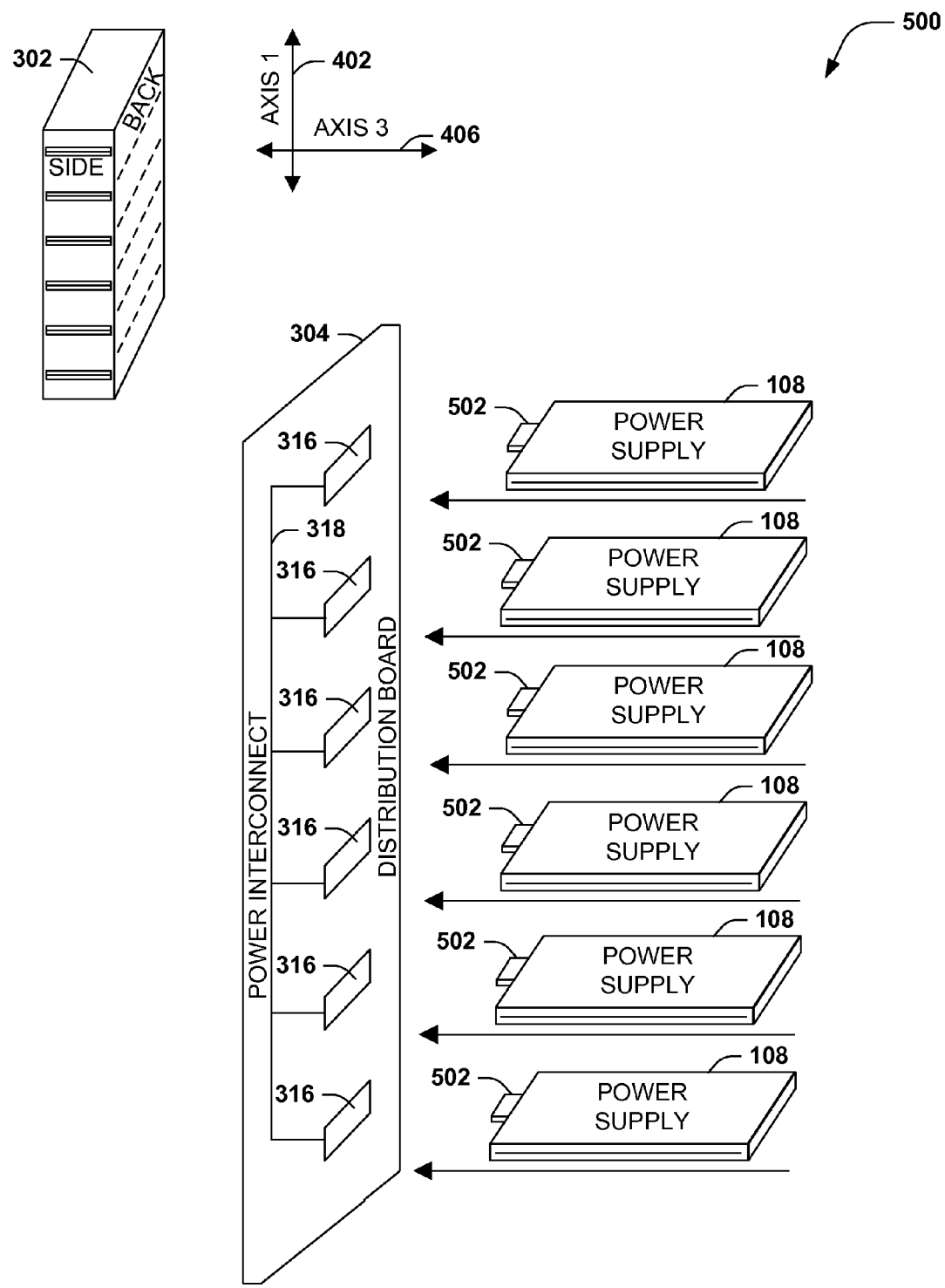
FIG. 5 is an illustration of an exemplary scenario featuring a second isometric view of an enclosure configured to distribute power among a set of load units and a set of power supplies according to the techniques presented herein.

FIG. 5 presents an illustration of an exemplary scenario 500 featuring a second isometric view of an exemplary enclosure 302 configured according to the techniques presented herein. In this exemplary scenario 500, the distribution board 304 is again presented in an orientation along the first axis 402 of the enclosure 302 and integrating a power interconnect 318. The power interconnect 318 interconnects the power supply connectors 316 also distributed along the first axis 402 of the enclosure 302, and oriented along the third axis 406 (e.g., facing backward) to connect with a power connector 502 of a power supply 108. The power supply connectors 316 are also oriented along the third axis 406 (e.g., inserted into the enclosure 302 from the back).

The enclosure 302 illustrated in FIGS. 4-5 thus exhibits an architecture selected according to the techniques presented herein for the distribution of power among a set of power supplies 108 and load units 204. In particular, this architecture presents several features that may confer advantages on this architecture as compared with other architectures (including those illustrated in the exemplary scenarios of FIGS. 1 and 2). As a first example, by decoupling the load units 204 from dedicated power supplies 108, this architecture enables fault tolerance for respective power supplies 108; e.g., a failure of one or even two power supplies 108 may be compensated by the connection of other, underutilized or unutilized power supplies 108 to the power interconnect 318, thereby providing N+1 or higher levels of resiliency. As a second example, the exemplary architecture presents a stack of load units 204 along the first axis 402, and a separate stack of power supplies 108 along the first axis 402. Moreover, by orienting the load units 204 and power supplies 108 along the same third axis 406 but in opposite directions, this architecture may enable access to the load units 204 and load boards 308 from the front of the enclosure 302 without obstruction from the power supplies 108, and may enable access to the power supplies 108 from the back of the enclosure 302 without obstruction from the load units 204 and load boards 308. This configuration thereby presents convenient accessibility to selected power distribution components without manual manipulation of other power distribution components. As a third example, the power supplies 108 are connected with the distribution board 304 not using power cables 112 and connector plugs 206, but using physical connectors, which may reduce the expense, space consumption, management, and other inefficiencies of cabling. Similarly, the load boards 312 connect with the load units 204 and the distribution board 304 using physical connectors rather than cabling. As a fourth example, the orthogonal orientation of the load boards 308 and the power supplies 108 may enable close proximity and a comparatively short power path between each power supply 108 and a load unit 204. This proximity may conserve the efficiency of the supplied power. Moreover, respective load units 204 may primarily draw power from the closest power supply 108, thereby reducing the local current through any portion of the power interconnect 318. As a result, rather than incorporating a high-current conductor such as a bus bar 208, the distribution board 304 and/or load boards 308 may be designed as a medium-current conductor, such as a printed circuit board (PCB), utilizing less conductive material and ordinary fabrication processes rather than specialized and comparatively expensive conductive material. These and other advantages may be achievable through the selected architecture of the enclosure 302 according to the techniques presented herein.

C. Variations

The power distribution architectures presented herein may be implemented with variations in many aspects, and some variations may present additional advantages and/or reduce disadvantages with respect to other variations of these and other architectures and implementations. Moreover, some variations may be implemented in combination, and some combinations may feature additional advantages and/or reduced disadvantages through synergistic cooperation.

C1. Scenarios

A first aspect that may vary among embodiments of these techniques relates to the scenarios wherein such techniques may be utilized.

As a first variation of this first aspect, the tray and enclosure architectures may implement many types of load units 204, such as file servers, webservers, database servers, and distributive processing servers. Additionally, the load units 204 may be configured with varying types and degrees of interoperability (e.g., a mutually isolated set of load units 204; an intercommunicating set of independent load units 204 interacting in a peer-to-peer or server-client model; and a tightly coupled set of load units 204, such as a symmetric multiprocessing (SMP) server). The computational resources representing respective load units 204 may be directly connected to the load boards 308, or may be included in a container such as a tray, a board, or a case. Moreover, respective load boards 308 may be configured to support one load unit 204, several load units 204 of the same or different types, or any variation thereof.

As a second variation of this first aspect, the architecture of an enclosure 302 may be provided as an integrated unit, or as different components provided by one or more vendors. For example, a vendor may provide a distribution board 304 configured for mounting in an enclosure 302 to interconnect power supplies 108 and load boards 308 further connected to one or more load units 204, where the distribution board 304 comprises a distribution board surface to be oriented along a first axis 402 of the enclosure 302. The distribution board surface may thus comprise at least two power connectors 316 respectively connectible with a power supply 108 to be oriented along a second axis 404 of the enclosure 302; at least one load board connector 306 respectively connectible with a load board 308 oriented along a third axis 406 of the enclosure 302; and a power interconnect 318 interconnecting the power supply connectors 316 and the load board connectors 306. The same vendor or another vendor may provide one or more load boards 308 configured to interconnect one or more load units 204 with power supplies 108 through a distribution board 304 oriented along a first axis 402 within an enclosure 302, where the load board 308 comprises a load board surface oriented along a third axis 406 of the enclosure 302, and comprises at least one load unit connector 308 respectively connectible with a load unit 204 oriented along a second axis 404 within the enclosure 302, and at least one distribution board connector 310 that is connectible with a load board connector 306 of the distribution board 304. The same or another vendor may also distribute the enclosure 302 configured to store the power distribution components; the load units 204; and/or the power supplies 108. Alternatively, the enclosure 302, distribution board 304, and load boards 308 may be provided together for use with load units 204 and power supplies 108. These and other architectural scenarios may be compatible with the techniques presented herein.

C2. Board Configurations

A second aspect that may vary among embodiments of these techniques relates to the design of the distribution board 304 and/or load boards 308.

As a first variation of this second aspect, the distribution board 304 and/or load boards 308 may be designed using many types of power distribution technologies and materials. In particular, the orthogonal orientation of the power distribution components presented herein may enable the design these components as printed circuit boards (PCBs), due to the comparatively short power path between the load units 204 and the power supplies 108 and the resulting low local current through respective portions of the power interconnect 318 and load boards 308. However, other designs, such as cabling or bus bars, may alternatively or additionally be utilized as the components of the power distribution techniques presented herein.

As a second variation of this second aspect, the connectors connecting respective components (including the load board connectors 306, the distribution board connectors 310, the load unit connectors 312, the load connectors 314, the power supply connectors 316, and the power connectors 502) may incorporate many types, shapes, materials, and/or features. As a first such example, the connectors may comprise physical connectors integrated with a printed circuit board or other solid-state unit, as depicted in FIGS. 4-5. Alternatively or additionally, such connectors may terminate a cable attached to a component, which may enable greater flexibility in the orientations of the components. As a second such example, the connectors may couple according to various mechanisms, such as interlocking physical parts or magnetic coupling. As a third such example, the connectors may be coupled through manual manipulation, or may automatically couple, such as blind-mate connectors that are configured to couple automatically even if a user is unable to visualize or reach the connectors.

As a third variation of this second aspect, the orientations of the components with respect to one another and with the enclosure 302 may vary among embodiments. As a first such example, the axes may be devised as illustrated in FIGS. 4-5, wherein the first axis 402 comprises a vertical axis, the second axis 404 comprises a lateral axis, and the third axis 406 comprises a sagittal axis, or according to other orientations of the axes. Additionally, the axes may be precisely orthogonal or only substantially orthogonal. As a second such example, the orientations of respective components may match or differ from the orientations of the connectors therebetween. For example, as illustrated in the exemplary scenario 400 of FIG. 4, the load board 310 is oriented along the second axis 404, and the distribution board connectors 310 and the load board connectors 306 are also oriented along the second axis 404 (e.g., facing laterally) and coplanar, and are coupled in this orientation. However, load connectors 314 of the load units 204 are oriented along the third axis 406 (e.g., facing the back of the enclosure 302), and are not coplanar with the load boards 308. The load unit connectors 312 on the load board 308 are therefore positioned as elbow connectors that first protrude along the first axis (e.g., rising vertically) and bend in the direction of the third axis 406 in order to couple with the load connectors 314 of the load units 204.

As a fourth variation of this second aspect, the power interconnect 318 may utilize many power routing techniques. For example, the power interconnect 318 may simply interconnect all of the power supply connectors 316 and all of the load board connectors 306; may selectably interconnect a selected subset of such connectors; or may provide selective one-to-one routing between power supply connectors 316 and load board connectors 306. Additionally, the power routing of the distribution board 304 may be fixed, may be adjustable by a user, or may be automatically adjusted according to a power routing logic (e.g., upon detecting a failure of a power supply 108, automatically re-routing power from a reserve power supply 108). These and other variations in the architectures of the boards and connectors may be devised by those of ordinary skill in the art while implementing the techniques presented herein.

C3. Enclosure Architecture

A third aspect that may vary among embodiments of these techniques relates to the architecture of the enclosure 302 storing the power distribution components.

As a first variation of this third aspect, the distribution board 304 may be positioned in many locations within the enclosure 302. As a first such example, the distribution board 304 may be positioned along a corner edge of the enclosure 302 to accommodate the orthogonal orientations of the load boards 308 and the power supplies 108. Alternatively, the distribution board 304 may be positioned at a middle edge or in a center are of the enclosure 302, e.g., in order to partition the enclosure 302 into a first region (e.g., a front half) for the load units 204 and a second region (e.g., a back half) for the power supplies 108.

As a second variation of this third aspect, respective power distribution components may be designed for mounting within the enclosure 302. As a first such example, the enclosure 302 may comprise an enclosure mounting component, and the distribution board 304 may comprise a distribution board mounting component that is configured to couple with the enclosure mounting component to mount the distribution board 304 within the enclosure 302. Alternatively or additionally, respective load boards 308 may comprise a load board mounting component that is configured to couple with an enclosure mounting component of the enclosure 302 to mount the load board within the enclosure 302. Additional mounting components may be provided for the load units 204 and/or power supplies 108. Moreover, the distribution board 304 and/or load boards 308 may be configured to detach from an enclosure mounting component, such that a user may choose to remove any of the distribution board 304, power supplies 108, and/or load boards 308 without having to remove load units 204 or other components within the enclosure 302. These components may be detachable individually or together (e.g., several power supplies 108 and the distribution board 304 may be mounted to a detachable side wall, which may be removed from the back of the enclosure 302 to access and service the power distribution system without repositioning the load boards 308 or load units 204, or vice versa). Additionally, the enclosure 302 may comprise at least one power supply guide that is configured to, upon insertion of a power supply 108 into the enclosure 302, guide the power supply 108 to connect with a power supply connector 316 of the distribution board 304 (e.g., rails mounted on the side walls of the enclosure 302 that guide power supplies 108 into a mount position), and/or one load unit guides configured to, upon insertion of a load unit 204 into the enclosure 302, guide the load unit 204 to connect with a load unit connector 312 of a load board 308.

As a third variation of this third aspect, the orientations of the distribution board 304, the power supplies 108, and the load units 204 within the enclosure 302 may vary, and many such variations may be compatible with the techniques presented herein.

Figure 6:
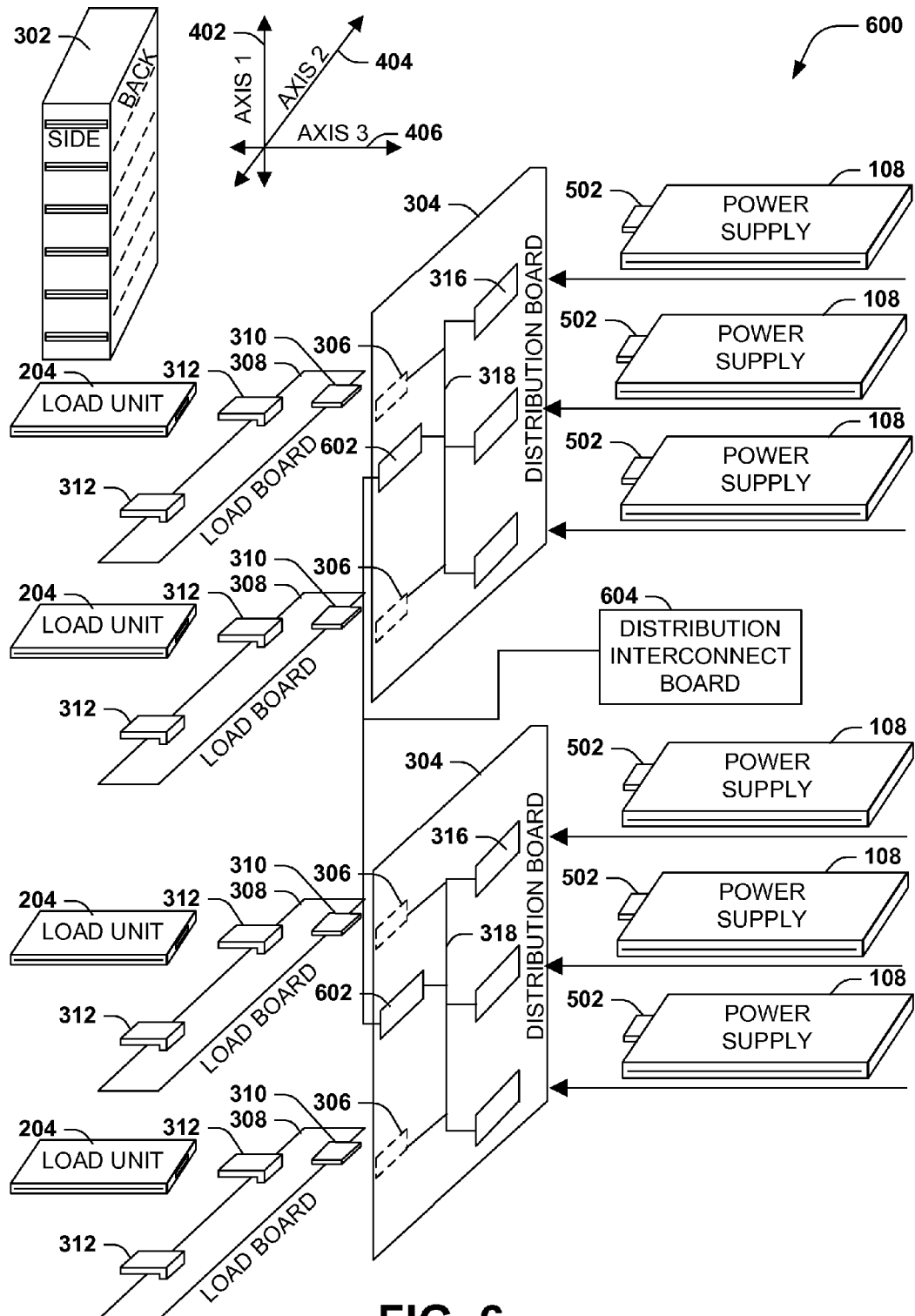
FIG. 6 is an illustration of an exemplary scenario featuring an enclosure comprising a power distribution system presented in a modular manner and with a first orientation.
Figure 7:
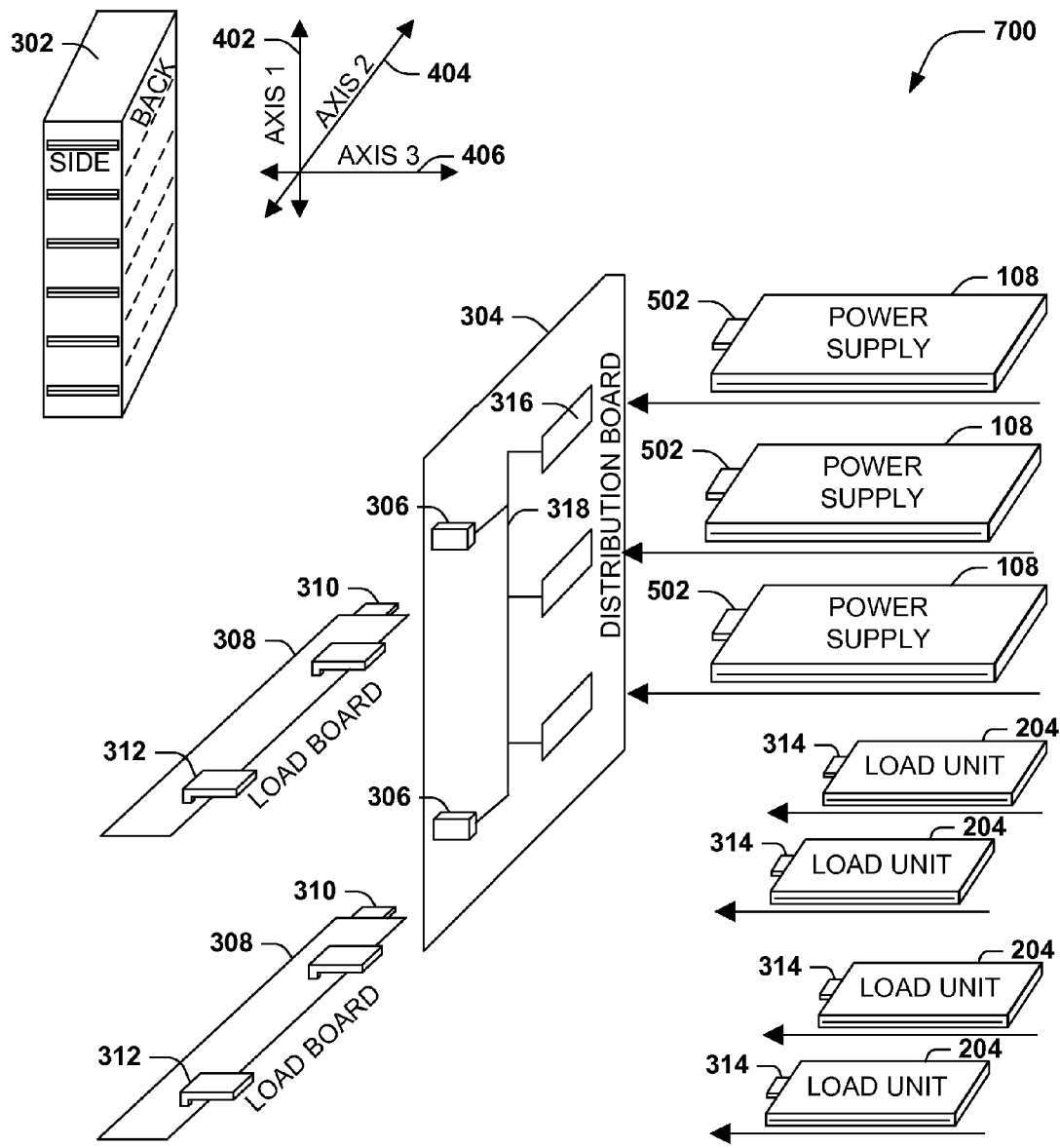
FIG. 7 is an illustration of an exemplary scenario featuring an enclosure comprising a power distribution system with a second orientation.

FIGS. 6 and 7 present two contrasting exemplary orientations of the components of the power distribution system. In the exemplary scenario 600 of FIG. 6, the distribution board 304 may orient the power supplies 108 and the load units 204 along the third axis 406 (e.g., both situated in a front-to-back orientation within the enclosure 302), but in opposite directions. For example, the distribution board surface of the distribution board 304 may comprise a first face comprising the power supply connectors 316 (e.g., facing toward the back of the enclosure 302), and a second face opposite the first face (e.g., facing toward the front of the enclosure 302) comprising the load board connectors 306. The distribution board connectors 310 of the load boards 308 are positioned on a side edge to couple with the load board connectors 306 while maintaining the orientation of the load boards 308 along the second axis 404. In this configuration, the power supplies 108 are oriented along the third axis opposite the load units 204 within the enclosure 302. This orientation may enable a physical separation of the load units 204 and power supplies 108 without significantly increasing the proximity thereamong. Conversely, in the exemplary scenario 700 of FIG. 7, the distribution board surface of the distribution board 304 comprises a single face comprising the power supply connectors 316 and the load board connectors 306, the power supplies 108 are oriented along the second axis aside the load units 312 within the enclosure 302.

As a fourth variation of this third aspect, and as further depicted in the exemplary scenario 600 of FIG. 6, the enclosure 302 may separate the load units 204 and/or power supplies 108 into two or more subsets, each subset connected to a different distribution board 304 within the enclosure 302. This separation may enable compartmentalization of power distribution; e.g., failures of multiple power supplies 108 attached to a first distribution board 304 that result in failures of the attached load units 204 may not affect the power supplies 108 and load units 204 attached to a second distribution board 304 within the same enclosure 302. Moreover, the power interconnects 318 of the distribution boards 304 within the same enclosure 302 or different enclosures 302 may be connectible in order to provide configurable grouping and power distribution. For example, and as further depicted in the exemplary scenario 600 of FIG. 6, respective power distribution boards 304 may comprise a distribution board interconnect 602 that is connectible (e.g., via a cable or a distribution interconnect board 604) with the distribution board interconnect 602 of a second distribution board 304 to interconnect the power interconnects 318 of the first distribution board 304 and the second distribution board 304.

As a fifth variation of this third aspect, the components of the power distribution system may integrate and/or interact with other components of the enclosure 302. As a first such example, the distribution board 304, load board connectors 306, load boards 308, load connectors 312, power supply connectors 316, and/or power interconnect 318 may integrate communication channels for power monitoring and/or management communications, such as an Advanced Configuration and Power Interface (ACPI) signal. As a second such example, the power distribution system may be oriented with respect to climate regulation components within the enclosure 302. For example, in the exemplary scenario 600 of FIG. 6, the distribution board 304 may serve as a wall of a plenum directing airflow toward the load units 204. The power supplies 108 may be positioned within or as part of the plenum (e.g., one or more power supplies 108 may include fans or other climate regulating components that may be integrated with the plenum of the enclosure 302), or may be positioned outside of the plenum (e.g., to expel the heat generated by the power supplies 108). Alternatively or additionally, respective load units 204 may comprise a load unit surface (e.g., a board or tray bottom supporting the computational units), and respective load boards 308 may be oriented to be coplanar with the load board surfaces of the load boards 308 (e.g., laying flat) in order to reduce obstruction of airflow directed at the load units 204 by climate regulating components of the enclosure 302. These and other variations may be incorporated into power distribution systems and enclosures 302 in accordance with the techniques presented herein.

D. Computing Environment

Figure 8:
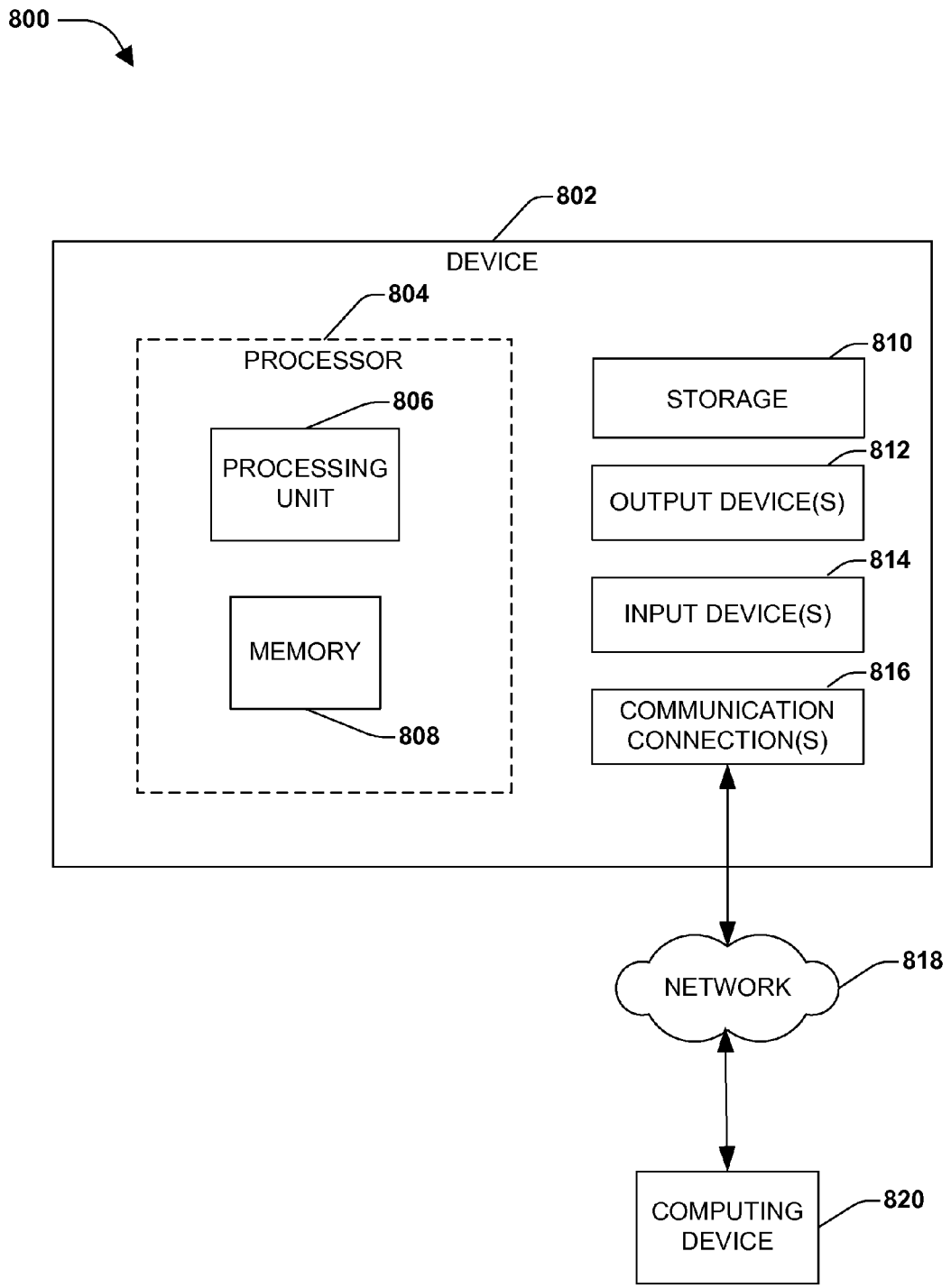
FIG. 8 is an illustration of an exemplary computing environment that may be incorporated in one or more load units.

FIG. 8 presents an illustration of an exemplary computing environment within a computing device 802 wherein the techniques presented herein may be implemented. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, and distributed computing environments that include any of the above systems or devices.

FIG. 8 illustrates an example of a system 800 comprising a computing device 802 configured to implement one or more embodiments provided herein. In one configuration, the computing device 802 includes at least one processor 806 and at least one memory component 808. Depending on the exact configuration and type of computing device, the memory component 808 may be volatile (such as RAM, for example), non-volatile (such as ROM, flash memory, etc., for example) or an intermediate or hybrid type of memory component. This configuration is illustrated in FIG. 8 by dashed line 804.

In some embodiments, device 802 may include additional features and/or functionality. For example, device 802 may include one or more additional storage components 810, including, but not limited to, a hard disk drive, a solid-state storage device, and/or other removable or non-removable magnetic or optical media. In one embodiment, computer-readable and processor-executable instructions implementing one or more embodiments provided herein are stored in the storage component 810. The storage component 810 may also store other data objects, such as components of an operating system, executable binaries comprising one or more applications, programming libraries (e.g., application programming interfaces (APIs), media objects, and documentation. The computer-readable instructions may be loaded in the memory component 808 for execution by the processor 806.

The computing device 802 may also include one or more communication components 816 that allows the computing device 802 to communicate with other devices. The one or more communication components 816 may comprise (e.g.,) a modem, a Network Interface Card (NIC), a radiofrequency transmitter/receiver, an infrared port, and a universal serial bus (USB) USB connection. Such communication components 816 may comprise a wired connection (connecting to a network through a physical cord, cable, or wire) or a wireless connection (communicating wirelessly with a networking device, such as through visible light, infrared, or one or more radiofrequencies.

The computing device 802 may include one or more input components 814, such as keyboard, mouse, pen, voice input device, touch input device, infrared cameras, or video input devices, and/or one or more output components 812, such as one or more displays, speakers, and printers. The input components 814 and/or output components 812 may be connected to the computing device 802 via a wired connection, a wireless connection, or any combination thereof. In one embodiment, an input component 814 or an output component 812 from another computing device may be used as input components 814 and/or output components 812 for the computing device 802.

The components of the computing device 802 may be connected by various interconnects, such as a bus. Such interconnects may include a Peripheral Component Interconnect (PCI), such as PCI Express, a Universal Serial Bus (USB), firewire (IEEE 794), an optical bus structure, and the like. In another embodiment, components of the computing device 802 may be interconnected by a network. For example, the memory component 808 may be comprised of multiple physical memory units located in different physical locations interconnected by a network.

Those skilled in the art will realize that storage devices utilized to store computer readable instructions may be distributed across a network. For example, a computing device 820 accessible via a network 818 may store computer readable instructions to implement one or more embodiments provided herein. The computing device 802 may access the computing device 820 and download a part or all of the computer readable instructions for execution. Alternatively, the computing device 802 may download pieces of the computer readable instructions, as needed, or some instructions may be executed at the computing device 802 and some at computing device 820.

E. Usage of Terms

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A distribution board configured to interconnect power supplies and load units respectively connected to a load board within an enclosure, the distribution board comprising:
   a distribution board surface oriented along a first axis of the enclosure and comprising:
      at least two power supply connectors respectively connectible with a power supply oriented along a second axis of the enclosure that is orthogonal with the first axis;
      at least two load board connectors respectively connectible with a load board oriented along a third axis of the enclosure that is orthogonal to the first axis and the second axis; and
      a power interconnect interconnecting the power supply connectors and the load board connectors.

2. The distribution board of claim 1, the power interconnect comprising a printed circuit board connecting the power supplies and the load board connectors.

3. A load board configured to interconnect load units with power supplies connected to a distribution board oriented along a first axis within an enclosure, the load board comprising:
   a load board surface oriented along a third axis of the enclosure that is orthogonal to the first axis, and comprising:

at least one load unit connector respectively connectible with a load unit oriented along a second axis within the enclosure that is orthogonal with the first axis and the second axis; and at least one distribution board connector connectible with a load board connector of the distribution board.

4. The load board of claim 3, the load board surface comprising a printed circuit board connecting the at least one distribution board connector and the at least one load unit connector.

5. The load board of claim 3:
respective load units comprising a load unit surface; and
respective load boards oriented coplanar with the load board surfaces within the enclosure.

6. The load board of claim 5, respective load unit connectors comprising an elbow connector oriented along the first axis with respect to the load board.

7. An enclosure configured to interconnect power supplies and load units, the enclosure comprising:
a distribution board comprising:
a distribution board surface oriented along a first axis of the enclosure and comprising:
at least two power supply connectors respectively connectible with a power supply oriented along a second axis of the enclosure that is orthogonal with the first axis;
at least two load board connectors respectively connectible with a load board connector of a load board; and
a power interconnect interconnecting the power supply connectors and the load board connectors; and
at least two load boards respectively comprising:
a load board surface oriented along a third axis of the enclosure that is orthogonal to the first axis and the second axis, and comprising:
at least two load unit connectors respectively connectible with a load unit oriented along the second axis of the enclosure; and
a distribution board connector connectible with a load board connector of the distribution board.

8. The enclosure of claim 7:
the power interconnect comprising a printed circuit board connecting the power supplies and the load board connectors; and
respective load boards comprising a printed circuit board connecting the distribution board connector and the load unit connectors.

9. The enclosure of claim 7:
the enclosure comprising an enclosure mounting component; and
the distribution board comprising a distribution board mounting component configured to couple with the enclosure mounting component to mount the distribution board within the enclosure.

10. The enclosure of claim 9, the distribution board mounting component configured to detach from the enclosure mounting component.

11. The enclosure of claim 7, the enclosure comprising at least one power supply guide configured to, upon insertion of a power supply into the enclosure, guide the power supply to connect with a power supply connector of the distribution board.

12. The enclosure of claim 7, the power supply connector comprising a blind-mate connector configured to connect with the power supply without manual manipulation by a user.

13. The enclosure of claim 7:
the enclosure comprising at least one enclosure mounting component; and
respective load boards comprising a load board mounting component configured to couple with an enclosure mounting component to mount the load board within the enclosure.

14. The enclosure of claim 13, respective load boards configured to detach from the enclosure mounting component.

15. The enclosure of claim 7, the enclosure comprising at least one load unit guide configured to, upon insertion of a load unit into the enclosure, guide the load unit to connect with a load unit connector of a load board.

16. The enclosure of claim 15, the load unit connector comprising a blind-mate connector configured to connect with the load unit without manual manipulation by a user.

17. The enclosure of claim 7:
the distribution board surface comprising a:
a first face comprising the power supply connectors, and
a second face opposite the first face and comprising the load board connectors; and
the power supplies oriented along the third axis opposite the load units within the enclosure.

18. The enclosure of claim 7:
the distribution board surface comprising a single face comprising the power supply connectors and the load board connectors; and
the power supplies oriented along the second axis aside the load units within the enclosure.

19. The enclosure of claim 7, the enclosure configured to store at least two distribution boards respectively connecting a set of power supplies to a set of load boards.

20. The enclosure of claim 19, respective distribution boards comprising: a distribution board interconnect connectible with the distribution board interconnect of a second distribution board to interconnect the power interconnects of the first distribution board and the second distribution board.

* * * * *